United States Patent
Chudzik et al.

(10) Patent No.: US 6,664,161 B2
(45) Date of Patent: Dec. 16, 2003

(54) METHOD AND STRUCTURE FOR SALICIDE TRENCH CAPACITOR PLATE ELECTRODE

(75) Inventors: Michael Patrick Chudzik, Beacon, NY (US); Jack Allan Mandelman, Stormville, NY (US); Carl John Radens, LaGrangeville, NY (US); Rajarao Jammy, Wappingers Falls, NY (US); Kenneth T. Settlemyer, Jr., Poughquag, NY (US); Padraic C. Shafer, Beacon, NY (US); Joseph F. Shepard, Jr., Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/137,268

(22) Filed: May 1, 2002

(65) Prior Publication Data
US 2003/0207532 A1 Nov. 6, 2003

(51) Int. Cl.[7] .......................................... H01L 21/8242
(52) U.S. Cl. ................... 438/243; 438/244; 438/386
(58) Field of Search ................... 438/243, 244, 438/255, 386, 387, 398; 257/68, 301, 304, 309

(56) References Cited

U.S. PATENT DOCUMENTS

| | | | |
|---|---|---|---|
| 5,012,308 A | | 4/1991 | Hieda .......................... 257/301 |
| 5,291,438 A | * | 3/1994 | Witek et al. ................ 365/149 |
| 5,336,912 A | * | 8/1994 | Ohtsuki ...................... 257/304 |
| 5,672,891 A | | 9/1997 | Hamamoto et al. ......... 257/301 |
| 5,804,851 A | | 9/1998 | Noguchi et al. ............ 257/304 |
| 5,943,581 A | * | 8/1999 | Lu et al. ..................... 438/386 |
| 5,956,595 A | * | 9/1999 | Zenke ........................ 438/398 |
| 6,020,609 A | | 2/2000 | Wu ............................. 257/309 |
| 6,033,967 A | * | 3/2000 | Li et al. ...................... 438/398 |
| 6,043,528 A | | 3/2000 | Aoki et al. ................. 257/301 |
| 6,057,571 A | | 5/2000 | Miller et al. ................ 257/296 |
| 6,090,655 A | * | 7/2000 | Zahurak et al. ............. 438/239 |
| 6,177,696 B1 | * | 1/2001 | Bronner et al. ............. 257/301 |
| 6,194,755 B1 | * | 2/2001 | Gambino et al. ........... 257/301 |
| 6,222,722 B1 | * | 4/2001 | Fukuzumi et al. .......... 361/305 |
| 6,249,017 B1 | | 6/2001 | Togo .......................... 257/301 |
| 6,271,557 B1 | | 8/2001 | Zimmermann et al. ..... 257/304 |
| 6,326,261 B1 | * | 12/2001 | Tsang et al. ................ 438/243 |
| 6,362,040 B1 | * | 3/2002 | Tews et al. ................. 438/246 |

FOREIGN PATENT DOCUMENTS

| JP | 63151070 | 6/1988 |
|---|---|---|
| JP | 2275662 | 11/1990 |

OTHER PUBLICATIONS

IBM Technical Disclosure Bulletin, "Shared trench one–device dynamic random–access memory cell", vol. 31, No. 7, Dec. 1988, pp. 307–308.

IBM Technical Disclosure Bulletin, "Groove–trench MIS capacitor", N. C. C. Lu, vol. 26, No. 2, Jul. 1983, pp. 489–490.

* cited by examiner

Primary Examiner—Wael Fahmy
Assistant Examiner—Hoai Pham
(74) Attorney, Agent, or Firm—Joseph P. Abate; Daryl K. Neff

(57) ABSTRACT

The present invention is a method and structure for fabricating a trench capacitor within a semiconductor substrate having a buried plate electrode formed of metal silicide. A collar is formed in a trench etched into a substrate; a conformal metal film is deposited thereover, and is annealed to form a silicide that is self-aligned to the collar. Silicide will not be formed on the collar, pads and other areas where the silicon is not directly exposed and hence the metal layer can be removed from these areas by selective etching.

11 Claims, 2 Drawing Sheets

6,664,161 B2

METHOD AND STRUCTURE FOR SALICIDE TRENCH CAPACITOR PLATE ELECTRODE

FIELD OF THE INVENTION

The invention relates to a semiconductor processing method, and more particularly to a method and structure for forming an electrode within a trench capacitor in a semiconductor substrate.

BACKGROUND OF THE INVENTION

A DRAM or a dynamic random access memory has a plurality of memory cells formed in a matrix manner on a substrate. Each memory cell typically includes a single transfer gate transistor coupled to a single capacitor. Three dimensionally configured capacitors have been developed and used for these memory cells to realize a higher degree of integration. The three dimensionally configured capacitors may be either of a stacked structure or of a trench structure. The trench structure is advantageous to the stacked structure in situations where the surface flatness of the device is of great importance. In this type of semiconductor memory, an opening is etched in a semiconductor substrate, and a storage capacitor is formed in the opening.

Storage capacitors require a plate electrode for maintaining a fixed reference potential, against which a value is stored in the memory cell as a variable potential on a node electrode, which is separated from the plate electrode by a node dielectric. When the plate electrode is formed on the outer wall of a trench capacitor beneath the upper surface of the semiconductor substrate, it is known as a buried plate.

An existing method of making the buried plate of a trench capacitor is by gas-phase doping of arsenic into the semiconductor sidewalls of the lower portion of the trench to form a buried plate outdiffusion. This creates a depletion region in the substrate region surrounding the trench. The depletion region, having a capacitance in series with the capacitance across the node dielectric, leads to a lower overall node capacitance. If depletion capacitance is eliminated, the improved node capacitance would help promote increased integration density by permitting smaller trenches to be used.

Moreover, gas-phase doping of arsenic to form the buried plate requires use of a compatible node electrode material, such as polysilicon, such that no workfunction difference exists between the node and plate electrode materials. In such way, the back bias on the plate electrode can be maintained at a level halfway (e.g. 0.75 V) between the low (0 V) and high (1.5V) node potentials, which is most desirable for signal margins and avoiding leakage current off the capacitor.

However, the resistivity of the node electrode is becoming a considerable factor in the switching speeds that are needed today. Polysilicon, though highly doped to form a node electrode, is still a semiconductor, and not as conductive as a low resistivity metal fill.

Metals and their suicides are of greater conductivity, and various silicides of metals have been proposed for use as node electrodes, including the silicides of titanium ($TiSi_2$), zirconium ($ZrSi_2$), chromium ($CrSi_2$), molybdenum ($MoSi_2$), tungsten ($WSi_2$), nickel ($NiSi_2$) and cobalt ($CoSi_2$). But when a metal or silicide is used as a node electrode in conjunction with a buried plate outdiffusion, a workfunction difference results, requiring the back bias on the buried plate to be changed to a potential which is not halfway between the low and high node potentials. Such altered back bias, as indicated above, is less desirable because it may lead to lower signal margins and higher leakage currents.

Not only the node electrode but the buried plate electrode, as well, requires low resistivity, because of the increasingly small cross section of the trench, and the switching speeds at which node potentials are driven. Gas phase As-doped silicon typically used in trench capacitor formation has resistivities on the order of 4.5 milliohms-cm, which corresponds to an As concentration of about $1 \times 10^{20}$ Atoms/cm$^3$. This As concentration is approaching the solid solubility limit of As in silicon at room temperature. Thus, further improvements are not foreseen in the resistivity of the buried plate when formed as an outdiffusion of As ions into silicon.

Therefore, a new method and structure is needed for trench capacitors that lowers buried plate resistivity, and improves the capacitance of the storage node.

SUMMARY OF THE INVENTION

An object of the present invention is to provide a structure and method for the formation of a buried plate capacitor electrode in a semiconductor substrate, where the plate is self-aligned with respect to a dielectric insulating collar in the upper region of the trench.

Another object of the invention is to provide a structure and method for forming a trench capacitor including a buried plate electrode having a low resistivity.

Another object of the present invention is to enable the introduction of a metal-insulator-metal (MIM) capacitor materials system in the trench storage capacitor where one of the metal electrodes is formed by salicide reaction between the silicon substrate and a metal.

Another object of the invention is to provide a trench capacitor having increased node capacitance by forming a buried plate electrode in a silicide layer which lines the sidewalls and bottom of a deep trench capacitor.

These and other objects are provided by the present method of fabricating a buried plate electrode within a trench cell capacitor of a semiconductor substrate, including forming a trench within a semiconductor substrate; forming an oxide collar in an upper portion of the trench; depositing a conformal metal film to cover a lower portion of the trench and the oxide collar; annealing the semiconductor substrate to form a self-aligned silicide layer in the lower portion of the trench; and selectively removing all or portions of the conformal metal film from an upper portion of the trench including the oxide collar.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE PREFERRED EMBODIMENTS

Figure 1:
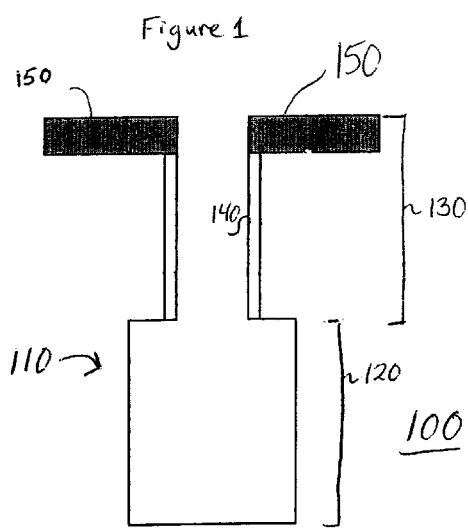
FIG. 1 is a cross-sectional view of a deep trench, prior to a buried plate formation process for a trench capacitor.

FIG. 1 is an illustration of a bottle-shaped deep trench 110 prior to a buried plate formation. Although the invention can be applied to a trench having straight sidewalls, to further enhance node capacitance, the present invention is preferably used together with any of several techniques for enhancing the surface area of the trench 110, such as a bottle shape, as shown here, a liner of hemispherical silicon grains, wavy trenches or other techniques, as known to those skilled in the art. Bottle shaped deep trenches, in particular, can be formed according to fabrication processes disclosed in U.S. Pat. No. 4,649,625 to Lu, and 5,692,281 to Rajeevakumar.

In FIG. 1, the trench is formed within a semiconductor substrate 100. The trench 110 is divided in two areas, a lower portion 120 and an upper portion 130. The upper portion 130 includes an oxide collar 140. Common oxidation techniques or oxide deposition techniques, well known to those in the art, are utilized in forming the collar 140, as shown in FIG. 1. A pad 150 of a material such as silicon nitride, overlays the semiconductor substrate 100, for use in protecting the substrate 100 during prior and subsequent processing steps applied to deep trench 110. In one or more steps prior to forming the collar, hemispherical silicon grains can be deposited into trench 110 to provide enhanced surface area. This will provide enhanced surface area at interfaces between the buried plate electrode, node dielectric and node electrode, to enhance node capacitance.

Figure 2:
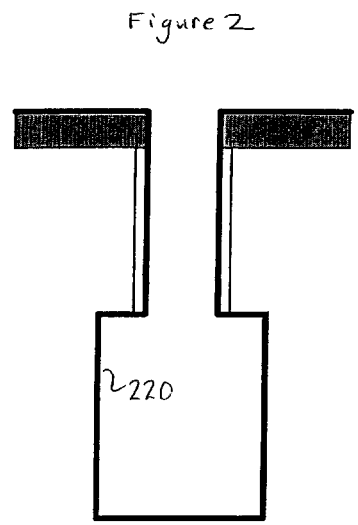
FIG. 2 shows a deep trench after depositing a conformal metal film therein prior to salicide formation.

FIG. 2 illustrates the trench capacitor of FIG. 1 after the deposition of a conformal metal thin film 220. Such deposition is performed by any conformal deposition technique, such as low pressure chemical vapor deposition (hereinafter LPCVD) and/or atomic layer chemical vapor deposition (hereinafter ALCVD), as known to those skilled in the art. If an LPCVD technique is used, the deposition of a highly conformal metal film may be performed at temperatures between 40° C.–700° C. and pressures ranging between 1 mTorr and 500 mTorr. Deposition times are dependent upon desired film thickness, the precursor used, and chamber pressure. Suitable metals for use in this process and the subsequent silicidation include hafnium (Hf), cobalt (Co), tungsten (W), and Nickel (Ni).

The flow chart provided in Table 1 below provides an example of an elemental metal deposition performed by the ALCVD technique. This example provides a description of a plasma enhanced process which can be used to deposit conformal metal films from the group IVB and VB elements. Details of the process are given in "Plasma-enhanced atomic layer deposition of Ta and Ti for interconnect diffusion barriers", S. M. Rossnagel, A. Sherman, and F. Turner, *J. Vac. Sci. Technol B* 18 (4) 2000, pp 2016; and "Atomic Layer Epitaxy of Copper", P. Martensson and J-O Carlsson, *J. Electrochemical Society*, Vol 145, No 8, 1998, pp 2926.

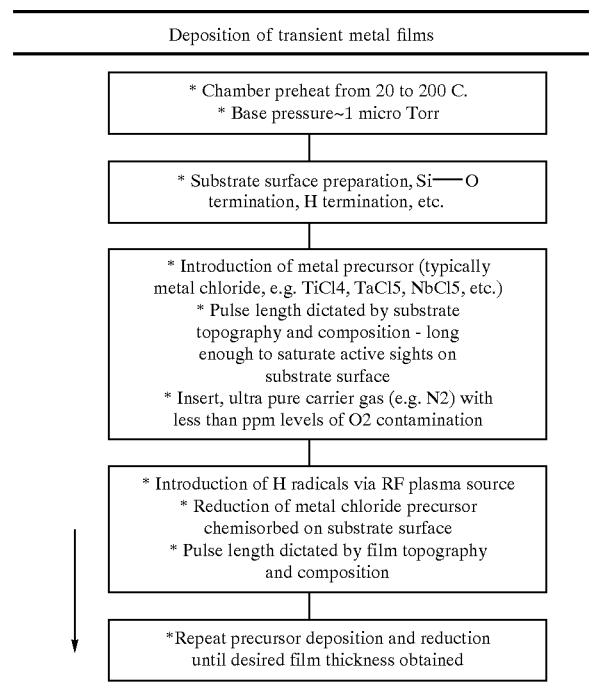

TABLE 1

Deposition of transient metal films

* Chamber preheat from 20 to 200 C.
* Base pressure~1 micro Torr

* Substrate surface preparation, Si——O termination, H termination, etc.

* Introduction of metal precursor (typically metal chloride, e.g. TiCl4, TaCl5, NbCl5, etc.)
* Pulse length dictated by substrate topography and composition - long enough to saturate active sights on substrate surface
* Insert, ultra pure carrier gas (e.g. N2) with less than ppm levels of O2 contamination

* Introduction of H radicals via RF plasma source
* Reduction of metal chloride precursor chemisorbed on substrate surface
* Pulse length dictated by film topography and composition

Figure 3:
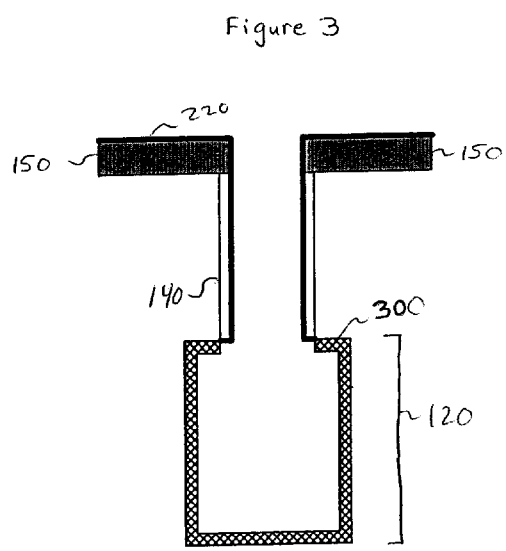
FIG. 3 shows the deep trench after salicide formation by high temperature annealing.

*Repeat precursor deposition and reduction until desired film thickness obtained FIG. 3 illustrates the formation of a self-aligned suicide by annealing. During annealing, the conformal metal film 220 reacts with the silicon in contact thereto in substrate 100 to form a silicide of the metal which is self-aligned to the collar 140. The self-aligned silicide ("salicide") in the lower portion 120 of trench 110 is now in place as a buried plate electrode for the trench capacitor.

Annealing call be performed in a single-wafer rapid thermal annealing (RTA) system or in a large batch style furnace. The oxidizing partial pressure is typically kept below 10–6 Torr to minimize silicate and metal oxide formation. For example, $TiSi_2$ is formed with a background partial pressure of oxygen less than 10 ppm to prevent $TiO_2$ formation. In some instances ($CoSi_2$ and $TiSi_2$) silicide formation is nucleation limited and it is advantageous to perform the annealing in a single-wafer RTA tool at high temperatures for short times, Typical annealing conditions for $CoSi_2$ formation in a RTA is temperatures in the range of 500° C.–800° C. for 30–60 seconds in an inert gas such as Ar or $N_2$ at pressures in the range of 10–100 milliTorr. As shown in FIG. 3, salicide 300 is formed in the lower portion 120, while metal film 220 remains unreacted where it overlays oxide collar 140 and the pad 150.

Figure 4:
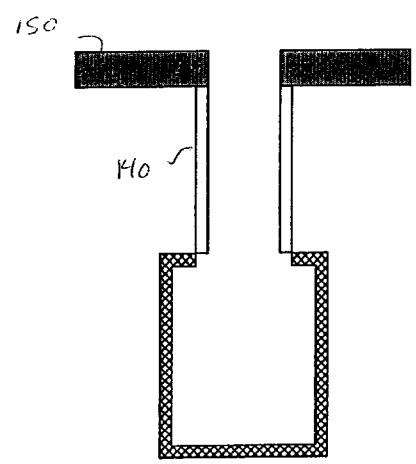
FIG. 4 shows the deep trench after removing the unreacted metal film after silicide formation.

If desired, the unreacted metal film 220 can be then removed from the collar 140 and pad 150, as shown in FIG. 4. The process chosen to remove the metal needs to be applicable to the particular material(s) used. Examples of the chemistries that can be used are numerous, and can be determined as applied to each circumstance.

Figure 5:
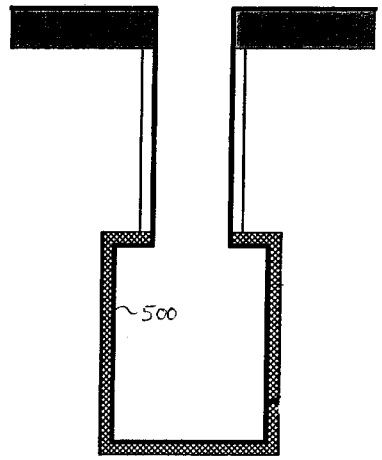
FIG. 5 shows the deep trench after depositing a thin node dielectric.

Next, as shown in FIG. 5, formation of the trench capacitor continues, with the deposition of a thin node dielectric 500. For this purpose, silicon oxynitride ($SiO_xN_y$) can be deposited by any suitable process, as is known and understood in the art. Alternatively, any of several high-K dielectric materials can be used, such as zirconium oxide (ZrO), hafnium oxide (HfO), or ferroelectric dielectric materials, in order to increase node capacitance, provided that such material types can be accommodated within the thermal budget required for subsequent processing.

Figure 6:
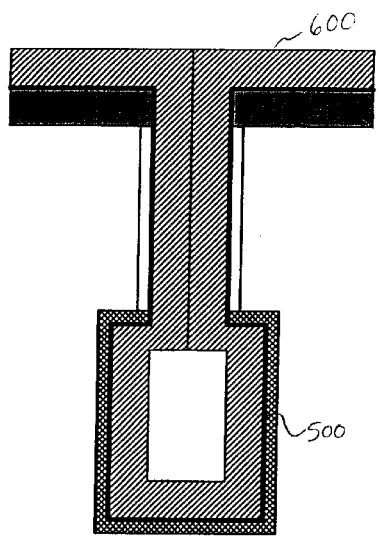
FIG. 6 shows the deep trench after depositing a conductive fill over the thin node dielectric in a step of fabricating a node electrode.
Figure 7:
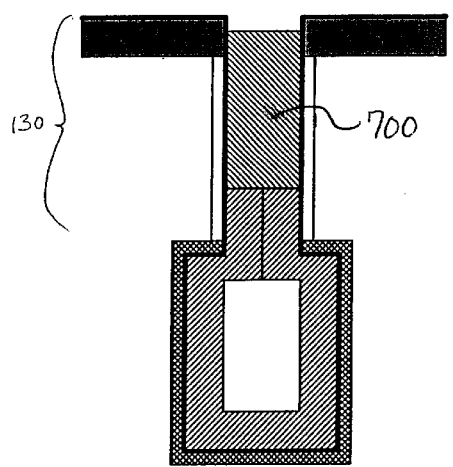
FIG. 7 shows the deep trench after recessing a conductive fill and depositing a polysilicon fill in an upper portion of the trench.

Next, as shown in FIG. 6, a conductive fill 600 is deposited over the node dielectric 500. The conductive fill 600, after subsequent processing, will eventually form the node electrode of the trench storage capacitor. The conductive fill 600 can be of a deposited polysilicon, or alternatively, of metal or a deposited metal silicide. If a metal or deposited silicide is used, it may be desirable thereafter to recess the metal or deposited silicide in the trench, and then deposit a polysilicon fill 700 in an upper portion 130 of the trench (FIG. 7).

Figure 8:
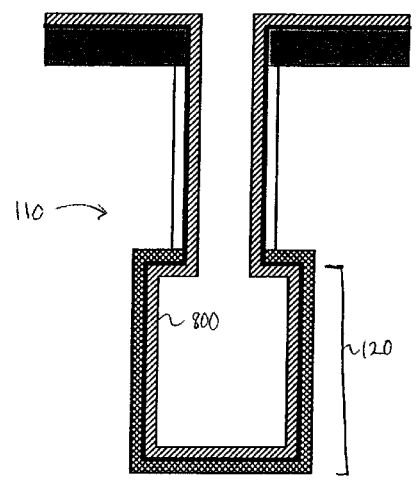
FIG. 8 shows the deep trench after depositing a conformal layer of material in fabricating a node electrode.

Alternatively, as shown in FIG. 8, a conformal thin layer of metal 800 may be deposited by a technique such as that described above with reference to FIG. 2, to form a node electrode within lower portion 120 of the trench 110. As yet another alternative instead of depositing metal, a conformal thin layer of polysilicon may be deposited, over which an appropriate silicide forming metal is deposited and reacted therewith by annealing to form a node electrode of silicide.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of fabricating a buried plate electrode within a trench cell capacitor of a semiconductor substrate, comprising:

forming a trench within said semiconductor substrate;

forming an oxide collar in an upper portion of said trench;

depositing a conformal metal film to cover a lower portion of said trench and said oxide collar;

annealing said semiconductor substrate to form a self-aligned silicide layer in said lower portion of said trench; and selectively removing all or portions of said conformal metal film from said oxide collar.

2. The method of claim 1 further comprising depositing hemispherical silicon grains in said trench prior to depositing said conformal metal film, such that said silicide layer has increased surface area.

3. The method of claim 2, wherein said collar is formed by trench sidewall oxidation at an oxidizing pressure below $10^{-6}$ Torr.

4. The method of claim 1 further comprising forming a node dielectric over said self-aligned silicide layer.

5. The method of claim 4 further comprising depositing polysilicon over said node dielectric, depositing a second conformal metal film over said polysilicon and annealing said second conformal metal film to form a silicide node electrode within said trench.

6. The method of claim 5 further comprising depositing polysilicon to fill said trench, thereby forming a node electrode.

7. The method of claim 1, wherein said metal film is deposited by low pressure chemical vapor deposition at temperatures ranging between 40° C. and 700° C.

8. The method of claim 7, wherein said low pressure chemical vapor deposition is performed at pressures between 1 mTorr and 500 mTorr.

9. The method of claim 8, wherein said low pressure chemical vapor deposition is performed by atomic layer chemical vapor deposition using a plasma enhanced process step.

10. The method of claim 1, wherein said annealing step is performed in a single-wafer rapid thermal annealing (RTA) system.

11. The method of claim 1, wherein said annealing step is performed in a large batch style furnace.

* * * * *